United States Patent
Parker et al.

(10) Patent No.: US 9,066,174 B2
(45) Date of Patent: *Jun. 23, 2015

(54) PORTABLE AUDIO SYSTEM WITH INTEGRATED HANDLE

(71) Applicant: Bose Corporation, Framingham, MA (US)

(72) Inventors: Robert Preston Parker, Westborough, MA (US); Roman Litovsky, Newton, MA (US); Jacky Chi-Hung Chan, Framingham, MA (US); Todd Charter Brown, Marlborough, MA (US); Lino A. Pucci, Wellesley Hills, MA (US)

(73) Assignee: Bose Corporation, Framingham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/956,460

(22) Filed: Aug. 1, 2013

(65) Prior Publication Data

US 2013/0315429 A1 Nov. 28, 2013

Related U.S. Application Data

(60) Continuation of application No. 13/033,893, filed on Feb. 24, 2011, now Pat. No. 8,503,709, which is a division of application No. 11/615,653, filed on Dec. 22, 2006, now Pat. No. 8,103,035.

(51) Int. Cl.
*H04R 9/06* (2006.01)
*H04R 1/28* (2006.01)
*H04R 1/02* (2006.01)

(52) U.S. Cl.
CPC .............. *H04R 1/02* (2013.01); *H04R 1/2857* (2013.01); *H04R 2205/021* (2013.01)

(58) Field of Classification Search
CPC ........ H04R 1/02; H04R 1/028; H04R 1/1016; H04R 1/1075; H04R 1/20; H04R 1/24; H04R 1/26; H04R 1/345; H04R 1/2826; H04R 1/2842; H04R 1/342; H04R 1/2857; H04R 2499/11; H04R 5/02; H04R 7/122; H04R 9/025; H04R 9/045; H04R 9/06; H04R 9/063; H04M 1/6041; H04M 1/6058; H04M 1/6066; H04M 2250/02
USPC .......... 381/334, 337–339, 386; 181/198, 199; 455/344–350, 556.1, 569.2; 361/679.23, 379.27

See application file for complete search history.

(56) References Cited

U.S. PATENT DOCUMENTS 5,821,471 A * 10/1998 McCuller ...................... 181/199

FOREIGN PATENT DOCUMENTS

| JP | 27-23086 | 7/1955 | |
| JP | 60259088 | * 12/1985 | ............... H04R 1/02 |

(Continued)

OTHER PUBLICATIONS

First Japanese Office Action dated Sep. 17, 2013 for Japanese Application No. 2012-187311.

(Continued)

*Primary Examiner* — Brian Ensey
(74) *Attorney, Agent, or Firm* — Bose Corporation

(57) ABSTRACT

An audio system includes a housing and an acoustic exit that exits the housing, and has a configuration that facilitates the grasping of the housing with a plurality of fingers from a single human hand. The acoustic exit is located adjacent an exterior surface of the housing such that the shape of the exit together with the exterior surface facilitates grasping of the housing with a plurality of fingers and the thumb from the single human hand and the acoustic exit exits a back surface of the housing such that the plurality of fingers can be inserted into the exit while the thumb of the same hand can rest on at least one of the top surface and the front surface of the housing.

20 Claims, 12 Drawing Sheets

(56) References Cited

FOREIGN PATENT DOCUMENTS

| | | |
|---|---|---|
| JP | H09-154194 A | 6/1997 |
| JP | H10-297571 | 11/1998 |
| JP | H11-27779 A | 1/1999 |
| JP | 11308681 | 11/1999 |
| JP | 2002-171461 A | 6/2002 |
| JP | 2002-300682 A | 10/2002 |
| JP | 2004-153488 A | 5/2004 |
| JP | 2005-237893 | 9/2005 |
| JP | 2005-337910 A | 12/2005 |
| WO | 2006113585 A2 | 10/2006 |

OTHER PUBLICATIONS

Japanese Decision of Rejection dated Sep. 2, 2014 for Japanese Patent Application No. 2012-187311.

* cited by examiner

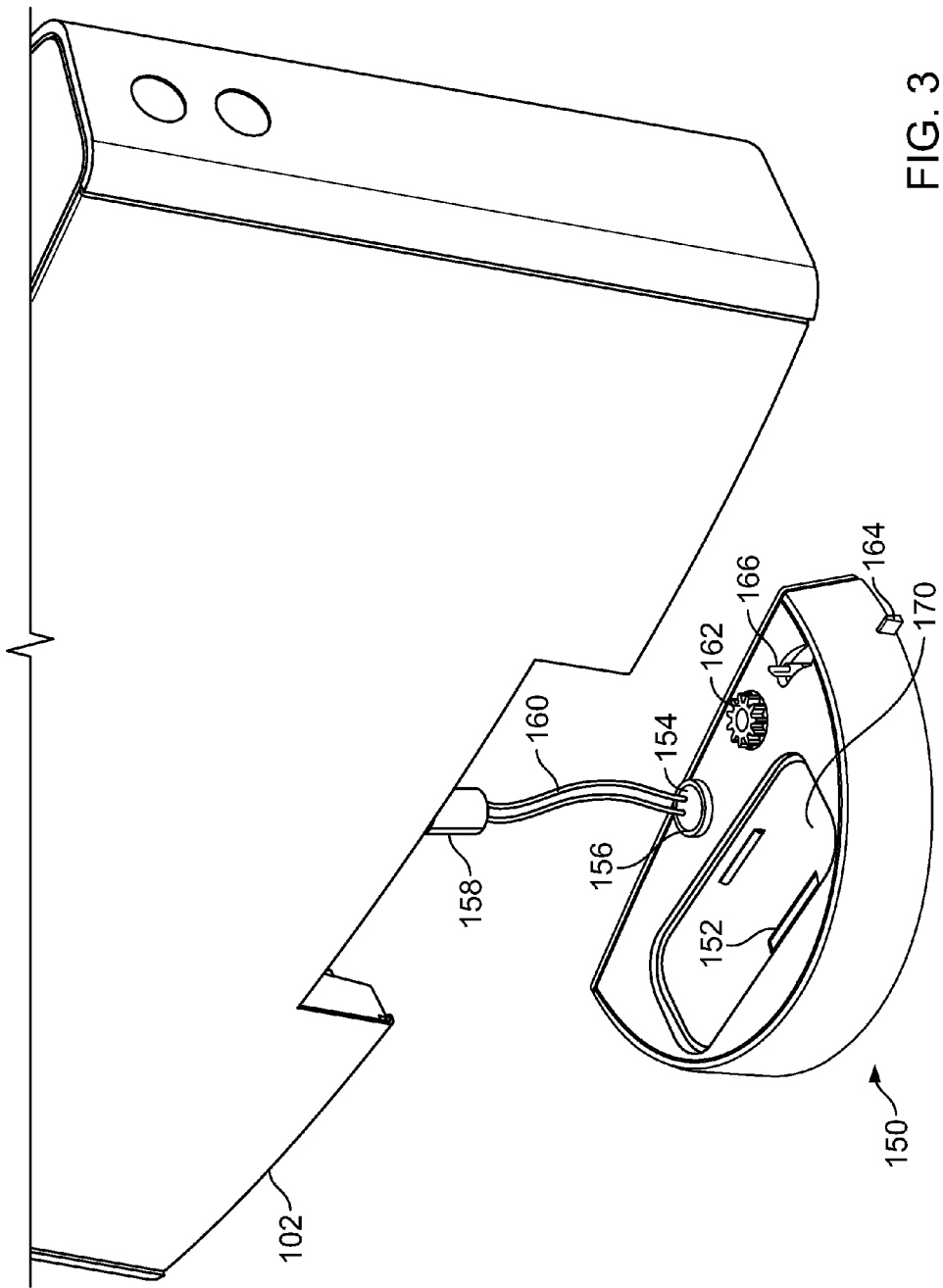

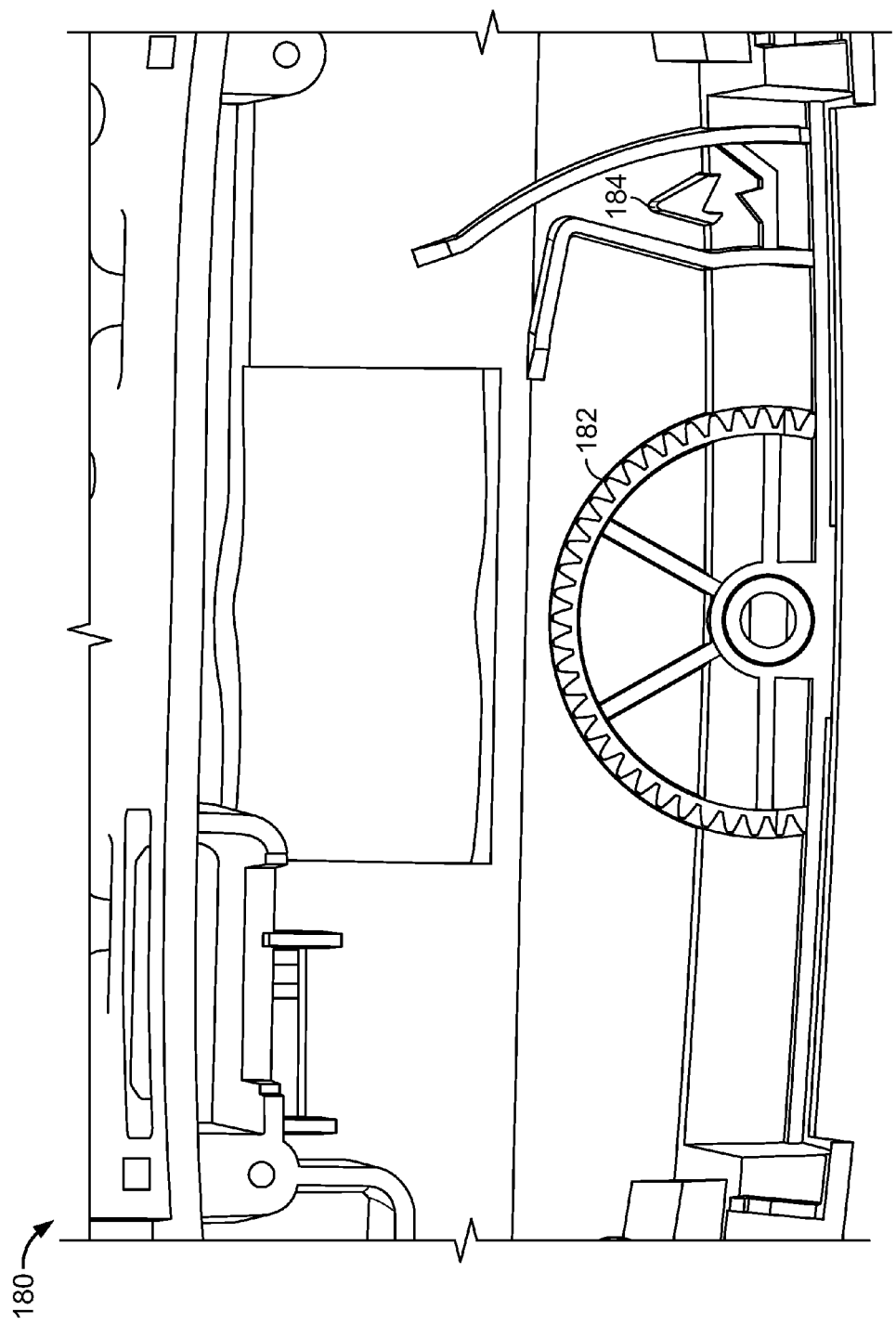

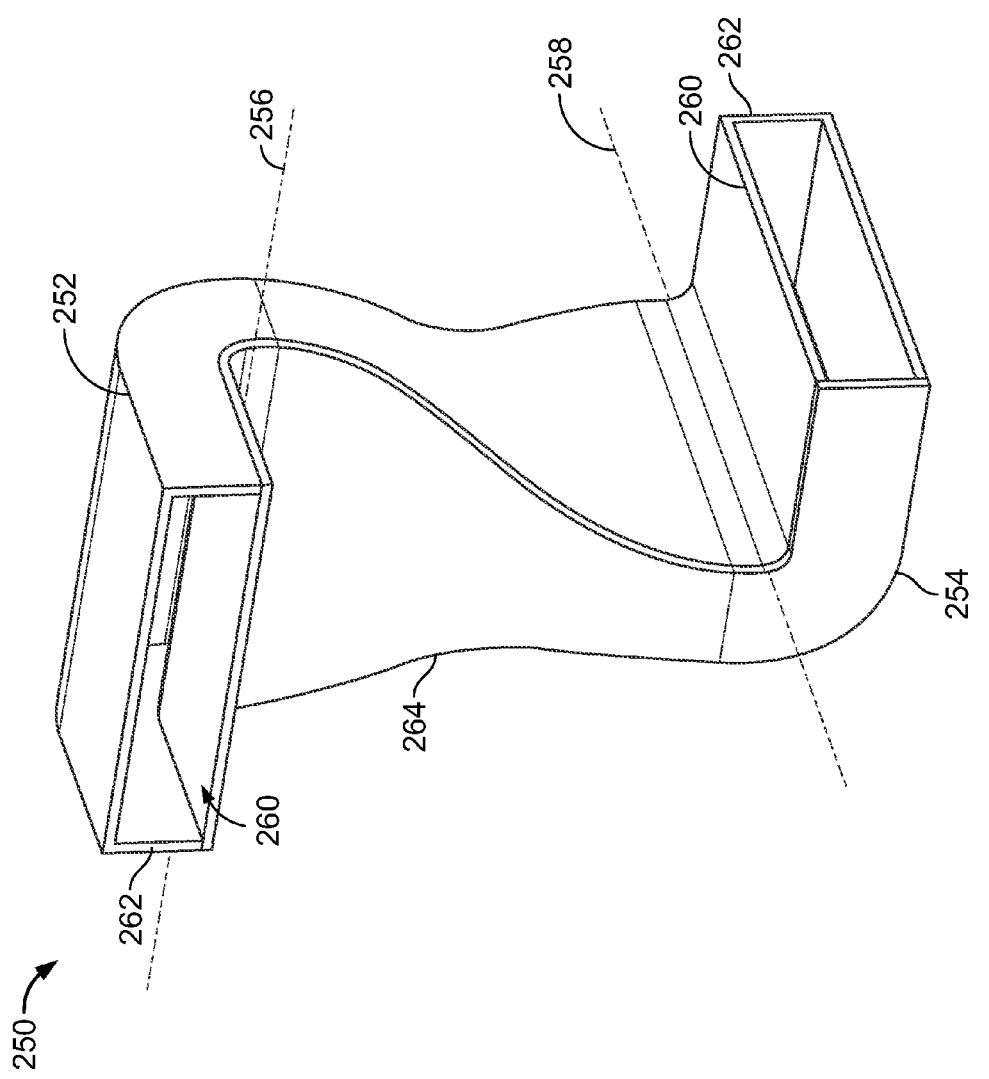

PORTABLE AUDIO SYSTEM WITH INTEGRATED HANDLE

CROSS-REFERENCE TO RELATED APPLICATION

This present application is a continuation of application Ser. No. 13/033,893, filed on Feb. 24, 2011 and issuing as U.S. Pat. No. 8,503,709, which is a divisional of application Ser. No. 11/615,653, filed on Dec. 22, 2006, and now issued as U.S. Pat. No. 8,103,035. The disclosures of the foregoing applications and/or patents are incorporated herein by reference.

BACKGROUND

Acoustic waveguides have been used in audio systems such as the commercially available Bose® WAVE® radio, WAVE® Radio/CD, and ACOUSTIC WAVE® music systems manufactured by Bose Corporation of Framingham, Mass.

SUMMARY

In one aspect, the invention is embodied in an apparatus that includes a housing. A waveguide is located within the housing. The waveguide includes a first subsection that bends around a first axis and has a first cross-sectional area with an aspect ratio that is substantially different from unity. A second subsection bends around a second axis that is non-parallel to the first axis and includes a second cross-sectional area with an aspect ratio that is substantially different from unity. A third subsection acoustically couples the first subsection to the second subsection. The third subsection includes a third cross-sectional area with an aspect ratio that varies between the first aspect ratio and the second aspect ratio.

In one embodiment, the waveguide is fabricated from a plurality of moldable parts. At least one of the first, second, and third cross-sectional areas includes a rectangular shape. At least one of the first, second, and third cross-sectional areas of the waveguide includes a long dimension and a short dimension and the first and the second subsections each bend around an axis parallel to the long dimension of the respective first and second subsection. In one embodiment, the third cross-sectional area of the waveguide comprises a long dimension and a short dimension and a first axis parallel to the long dimension and a second axis parallel to the short dimension are substantially not rotating when the aspect ratio of the third subsection varies.

The first cross-sectional area and the second cross-sectional area can be identical. In one embodiment, the first cross-sectional area is smaller than the second cross-sectional area. The aspect ratio of the first cross-sectional area can be different than the aspect ratio of the second cross-sectional area.

In one embodiment, the first axis is substantially perpendicular to the second axis. In one embodiment, one of the first and second subsections bends around a cavity. The cavity can be sized to reduce a resonance peak in the waveguide.

The waveguide includes an open end having a shape that facilitates the grasping of the housing with a plurality of fingers from a single human hand. A docking cradle can be mechanically coupled to the housing such that the docking cradle is capable of being rotated horizontally between an open position and a closed position . . . .

In another aspect, the invention is embodied in an apparatus having a housing. An electronic audio circuit is coupled to the housing. An acoustic exit that exits the housing. The acoustic exit has a shape that facilitates the grasping of the housing with a plurality of fingers from a single human hand. The acoustic exit is the exit to a waveguide or a port.

The acoustic exit can be located next to an exterior surface of the housing such that the shape of the open end together with the exterior surface facilitates the grasping of the housing with a plurality of fingers and the thumb from a single human hand. In one embodiment, the acoustic exit includes a flared end. An inside surface of the acoustic exit can include a textured surface. The textured surface can facilitate gripping the inside surface of the acoustic exit with the plurality of fingers from the human hand.

The housing can substantially encase a portable audio system. A docking cradle can be mechanically coupled to the housing such that the docking cradle is capable of being rotated horizontally between an open position and a closed position.

In another aspect, the invention is embodied in a waveguide. The waveguide includes a first subsection that bends around a first axis and has a first cross-sectional area with an aspect ratio that is substantially different from unity. A second subsection bends around a second axis that is non-parallel to the first axis and includes a second cross-sectional area with an aspect ratio that is substantially different from unity. A third subsection acoustically couples the first subsection to the second subsection. The third subsection includes a third cross-sectional area with an aspect ratio that varies between the first aspect ratio and the second aspect ratio.

The waveguide can be fabricated from a plurality of moldable parts. In one embodiment, at least one of the first, second, and third subsections is fabricated from a plurality of moldable parts.

At least one of the first, second, and third cross-sectional areas can include a rectangular shape. At least one of the first, second, and third cross-sectional areas includes a long dimension and a short dimension and the first and the second subsections each bend around an axis parallel to the long dimension of the respective first and second subsection.

In one embodiment, at least one of the first and second subsections bends around a cavity. The third cross-sectional area of the waveguide comprises a long dimension and a short dimension and a first axis parallel to the long dimension and a second axis parallel to the short dimension are substantially not rotating when the aspect ratio of the third subsection varies.

BRIEF DESCRIPTION OF THE DRAWINGS

FIG. 3 illustrates a partially exploded view of a docking cradle of the portable audio system.

FIG. 4 illustrates a bottom view of a section of the housing that accommodates the docking cradle.

FIG. 7A is a perspective view of a waveguide according to one embodiment of the invention.

DETAILED DESCRIPTION

Exemplary acoustic waveguides can be found in U.S. Pat. Nos. 4,628,528 and 6,278,789 and patent application Ser. No. 10/699,304, filed Oct. 31, 2003.

Figure 1A:
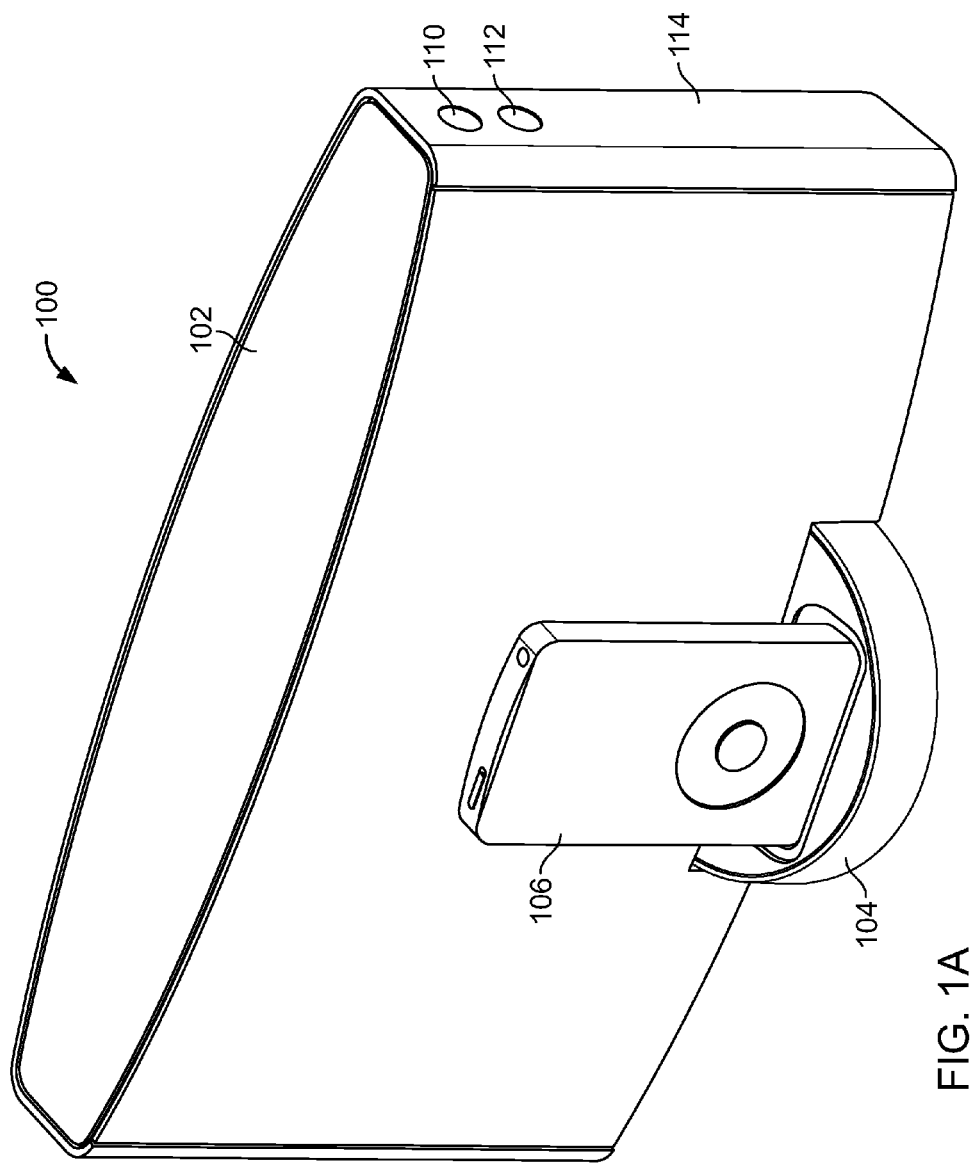
FIG. 1A is a front perspective view of a portable audio system according to one embodiment of the invention.

FIG. 1A is a front perspective view of a portable audio system 100. The portable audio system 100 includes a housing 102 and a docking cradle 104. A portable music player such as a MP3 player 106 is shown connected to the docking cradle 104. The docking cradle 104 can be rotated relative to the housing 102 as will be discussed in detail herein. The portable audio system 100 can also include one or more controls 110, 112 located on a side surface 114 of the housing 102. For example, the controls 110, 112 can be volume controls, track selection controls, skip, stop, pause, rewind, fast forward, and/or play control or can be designed to control any other desired function. Additionally, the controls can be located on any desired surface of the housing 102. In one embodiment (not shown), the control functions can be activated via a remote control with or without physical controls on the housing 102. The remote control can be an infrared (IR) remote or a radio frequency (RF) remote. In one embodiment (not shown), a front surface 116 (FIG. 1B) of the housing 102 can include a display. For example, the display can be an LCD display that is capable of displaying information, graphics and/or video images.

Figure 1B:
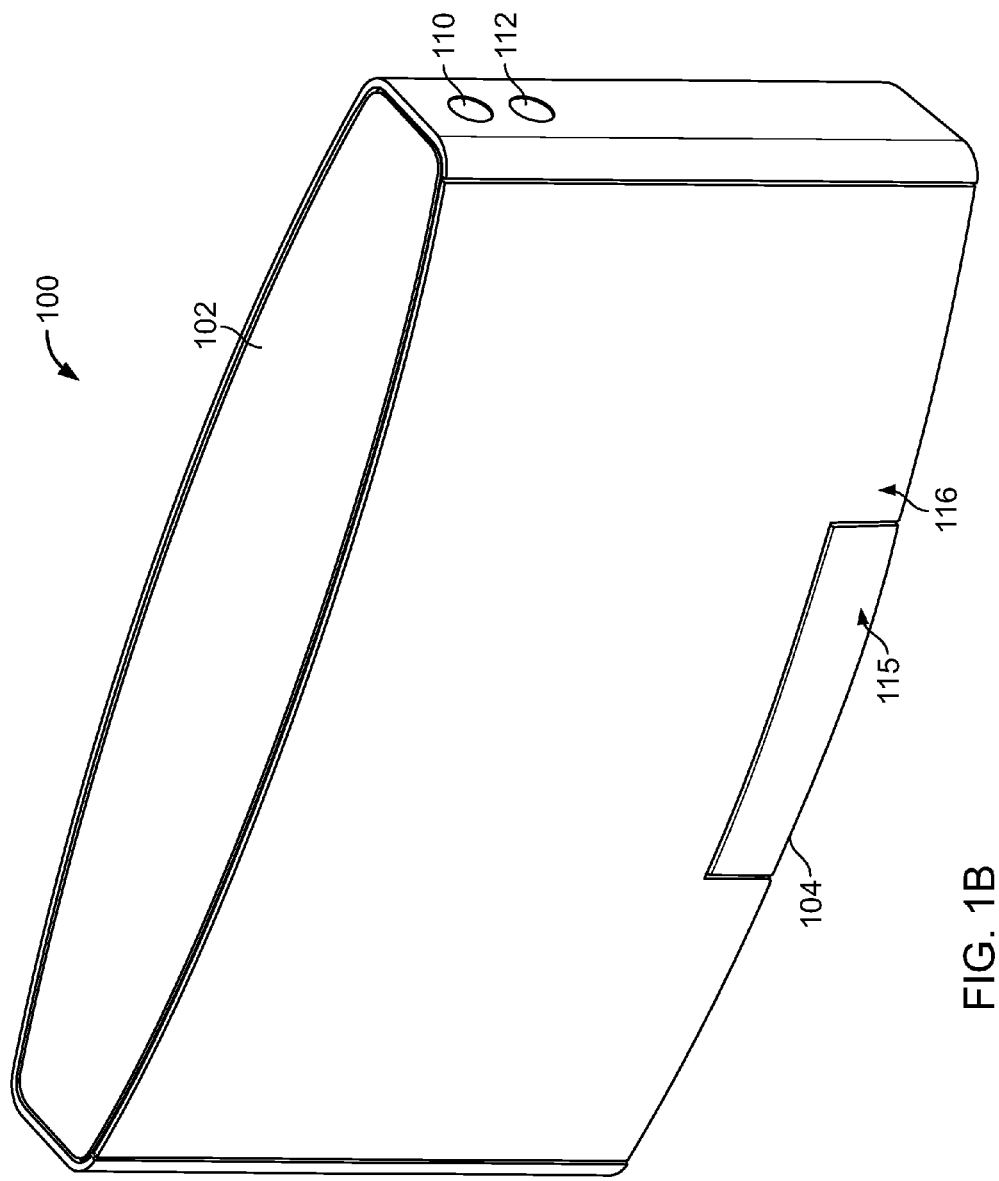
FIG. 1B illustrates another front perspective view of the portable audio system of FIG. 1A.

FIG. 1B illustrates another front perspective view of the portable audio system 100 of FIG. 1A. In this view, the docking cradle 104 is shown in the closed position relative to the housing 102. In one embodiment, an exposed surface 115 of the docking cradle 104 is substantially flush with a front surface 116 of the portable audio system 100.

Figure 1C:
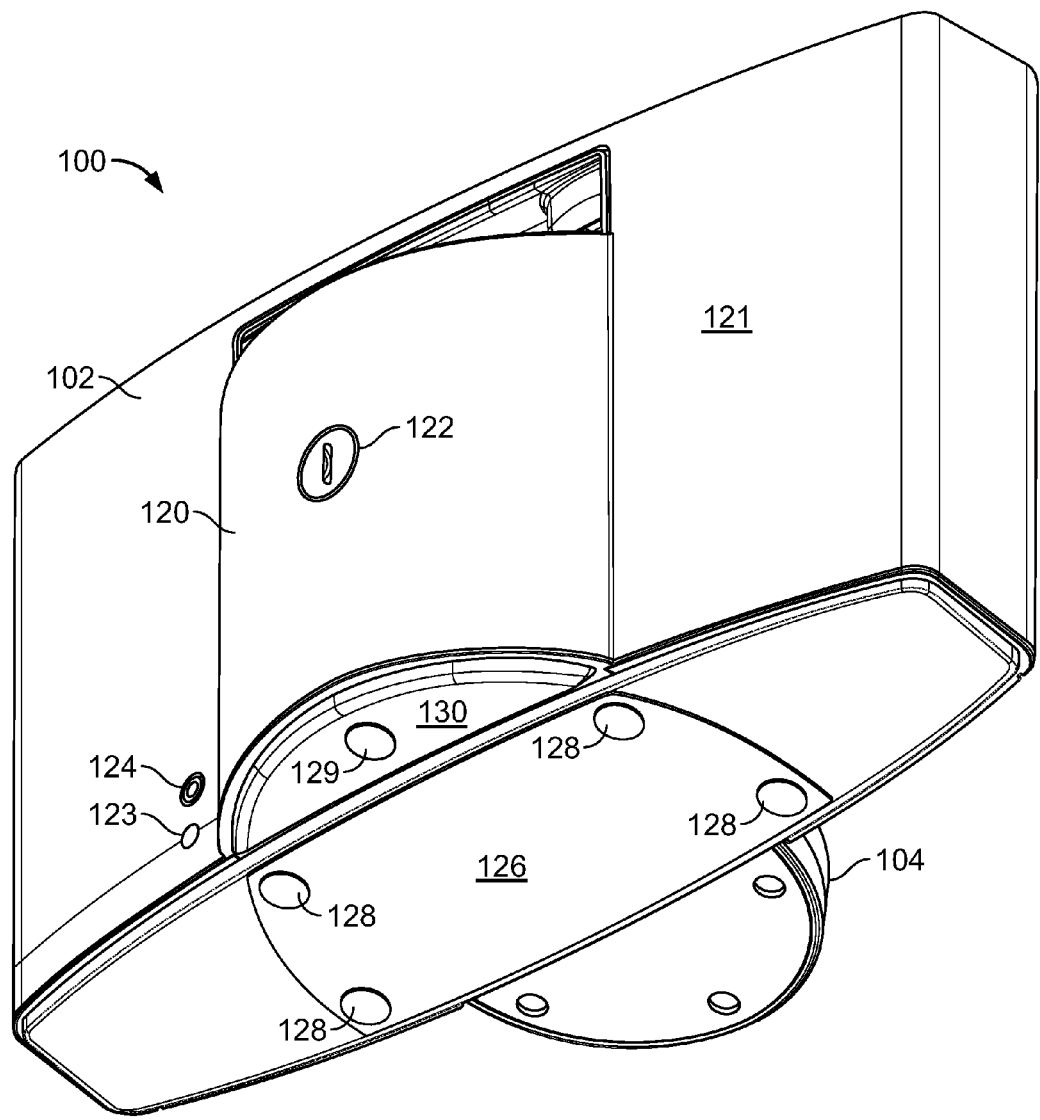
FIG. 1C illustrates a bottom perspective view of the portable audio system of FIG. 1A.

FIG. 1C illustrates a bottom perspective view of the portable audio system 100 of FIG. 1A. The docking cradle 104 is shown in the open position. The portable audio system 100 can include a portable energy source 120, such as a battery that is secured to the rear surface 121 of the housing 102 of the portable audio system 100 with a screw 122. Other techniques for securing the portable energy source 120 to the housing 102, such as a latching mechanism, can also be used. The battery can be a rechargeable battery. The portable energy source 120 is described in more detail herein.

The portable audio system 100 can also include a power input terminal 123 for connecting an external power source (not shown) to the portable audio system 100. The external power source can supply power to the portable audio system 100 and can also charge the portable energy source 120. An auxiliary audio input terminal 124 can be used to connect an external audio source (not shown) to the portable audio system 100. The external audio source (not shown) can include a MP3 player, a CD player, a DVD player, a satellite radio, a terrestrial radio, a tape player, a PDA, a computer, a cellular telephone, and/or a digital camera.

The bottom surface 126 of the housing 102 can include feet 128. The feet 128 can be fabricated from rubber, plastic, silicone, polypropylene, or any other suitable material. In one embodiment, the feet 128 mechanically isolate the portable audio system 100 from the surface on which it sits. The feet 128 can also prevent the portable audio system 100 from "walking" across the surface when the portable audio system 100 is outputting an audio program. A foot 129 can also be attached to a bottom surface 130 of the portable energy source 120.

Figure 2A:
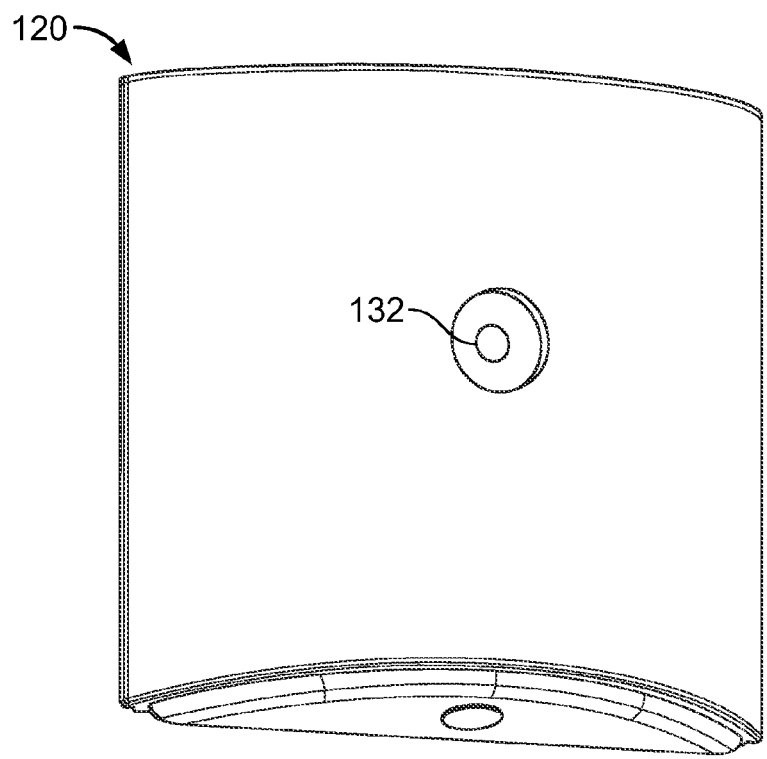
FIG. 2A illustrates a front perspective view of a portable energy source for powering a portable audio system.

FIG. 2A illustrates a front perspective view of a portable energy source 120 for powering a portable audio system 100. In one embodiment, the portable energy source 120 is a rechargeable battery pack. The rechargeable battery pack can include one or more NiCad cells, NiMH cells or Li-ion cells. An aperture 132 for a securing mechanism is also shown. The securing mechanism secures the portable energy source 120 to the housing 102 (FIG. 1C). The securing mechanism can include a screw that mates with a nut, threaded insert or PEM in the housing 102. The screw can be a thumb screw or can include slots that mate with a flat head or Phillips head screwdriver, for example. The portable energy source 120 can be designed to have any desired shape and/or size.

Figure 2B:
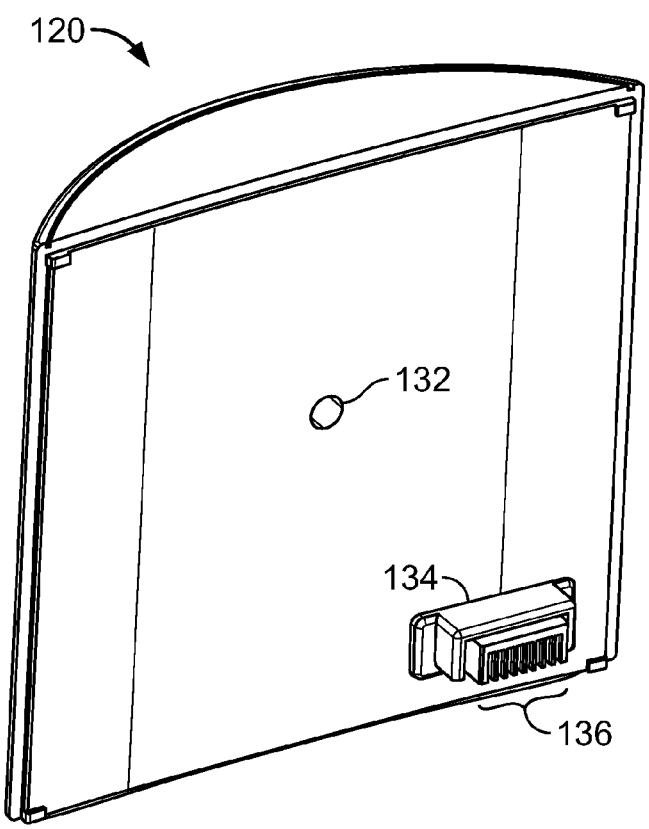
FIG. 2B illustrates a back perspective view of the portable energy source of FIG. 2A.

FIG. 2B illustrates a back perspective view of the portable energy source 120 of FIG. 2A. The portable energy source 120 includes a connector 134. The connector 134 can include multiple conductors 136. For example, the conductors 136 can carry power as well as data signals. The data signals can include information such as charge rate, current, voltage, charge history, capacity, charging parameters, cell chemistry, or any other data related to the portable energy source 120. The aperture 132 of the securing mechanism for securing the portable energy source 120 to the housing 102 is also shown.

FIG. 3 illustrates a partially exploded view of a docking cradle 150 of the portable audio system 100. The docking cradle 150 is designed to rotate from a closed position in which a connector 152 is concealed by the housing 102 to an open position in which the connector 152 is accessible to an external audio source (not shown). Specific contacts in the connector 152 can supply power to a docked external audio source. The power can be used to activate the external audio source and/or to charge a rechargeable battery within the external audio source. Specific contacts in the connector 152 can carry audio signals from the external audio source to circuitry within the portable audio system 100 (FIG. 1A).

The docking cradle 150 can be coupled to the housing 102 through various mechanical techniques. In one embodiment, the docking cradle 150 includes an aperture 154 having a lip 156. A hollow rod 158 or tube that is coupled to the housing 102 fits inside the aperture 154 such that the docking cradle 150 rotates around the hollow rod 158. The lip 156 provides a bearing surface that allows the docking cradle 150 to rotate about the hollow rod 158. The hollow rod 158 also acts as a conduit for cables 160 emanating from the docking cradle 150 that terminate inside the housing 102.

In one embodiment, the docking cradle 150 also includes a gear or pinion 162 that is coupled to a vicious damper (not shown). The vicious damper can be embedded within the docking cradle 150. The vicious damper can also be viscous grease applied to the gear or pinion 162. The viscous damper allows the docking cradle 150 to rotate smoothly from the closed position to the open position and vice versa. The pinion 162 engages a rack (not shown) that is located within the housing 102.

The docking cradle 150 also includes a stop 164 that is positioned to prevent the docking cradle 150 from over-rotating in the open position. The stop 164 on the docking cradle 150 mates with a feature (not shown) inside the housing 102.

The docking cradle 150 also includes a latching mechanism 166 that locks the docking cradle 150 in the closed position and prevents the docking cradle 150 from inadvertently rotating to the open position. The latching mechanism 166 engages with a catch (not shown) that is located inside the housing 102. In one embodiment, the latching mechanism 166 includes a non-spring loaded latch. Other latching techniques can also be used. For example, the latching system can include a spring-loaded touch latch (not shown).

In one embodiment, the docking cradle 150 can rotate by about 170.0 degrees. The 170.0 degree angle allows a portion of the docking cradle 150 to remain concealed by the housing 102 when the docking cradle 150 is in either the open or closed positions. It should be noted that the docking cradle 150 can be designed to rotate by any desired amount.

In one embodiment, the docking cradle 150 is mounted to the housing 102 such that various electrical and mechanical features on the docking cradle 150 are located on the portion of the docking cradle 150 that is always concealed by the housing 102. For example, the pinion 162, the latching mechanism 166, the stop 164, the cables 160, and the hollow rod 158 are concealed by the housing 102 when the docking cradle 150 is either in the open position, the closed position, or any transitional position between the open and the closed positions.

The docking cradle 150 also includes a pocket 170 that accepts adapters (not shown) that correspond to various external audio sources. For example, each adapter is designed to receive a specific external audio source having a particular size and shape. In one embodiment, each adapter includes a slot that allows the connector 152 to mate with a connector on the external audio source. In another embodiment, each adapter includes a connector interface that is configured to route power and data signals between individual external audio sources and the portable audio system 100.

FIG. 4 illustrates a bottom view of a section 180 of the housing 102 that accommodates the docking cradle 150. This section 180 includes a rack 182 that engages the pinion 162 (FIG. 3) including the viscous damper on the docking cradle 150. The rack 182 can be secured to the housing 102 using various techniques. In one embodiment, the rack 182 is molded into the housing 102. The rack 182 and pinion 162 provide a controlled motion when the docking cradle 150 is transitioned between the closed position and the open position. In this embodiment, the shape of the rack 182 is semicircular having a specific radius. However, the rack 182 can be any suitable shape and/or size. Additionally, the number and size of the teeth on the rack 182 and pinion 162 can be selected based on design parameters.

The section 180 of the housing 102 also includes the catch 184 that engages the latch 166 (FIG. 3). The latch 166 engages the catch 184 when rotating the docking cradle 150 to the closed position. The latch 166 disengages the catch 184 when the right side of the docking cradle 150 is pushed towards the housing 102. Other latching mechanisms can also be used such as a spring loaded touch latch.

Figure 5A:
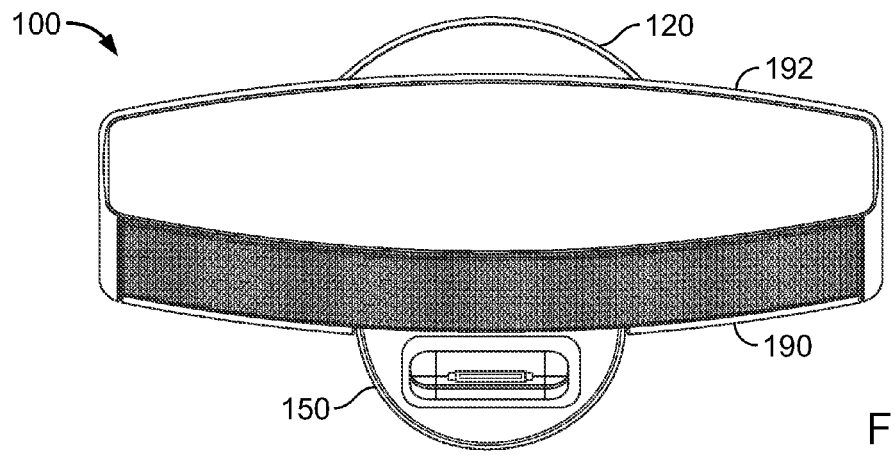
FIGS. 5A-5C illustrate, respectively, a top view, a front view and a side view of the portable audio system.
Figure 5B:
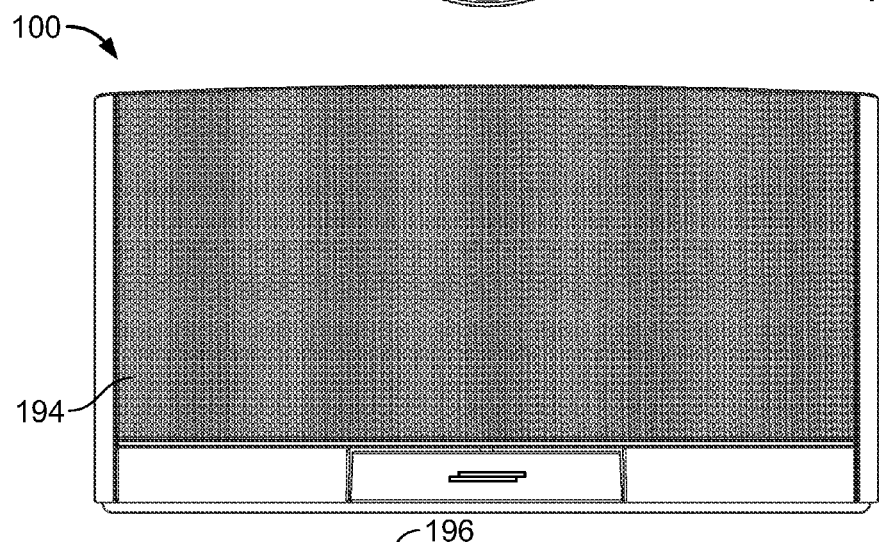
Figure 5C:
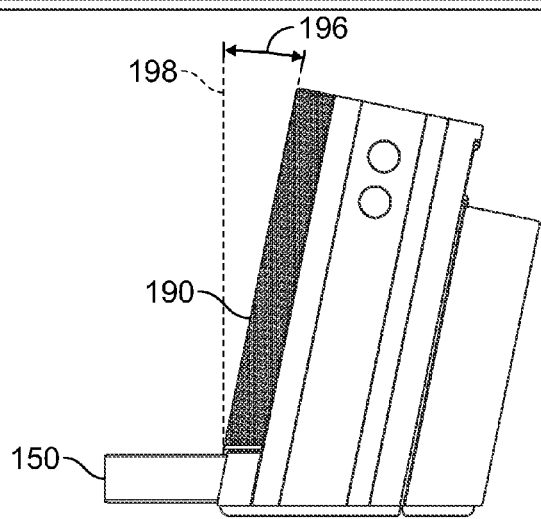

FIGS. 5A-5C illustrate, respectively, a top view, a front view and a side view of the portable audio system 100 of the present invention. The top view of FIG. 5A shows the docking cradle 150 in the open position. A front surface 190 of the portable audio system 100 includes a curved shape. The front surface 190 can also have a flat shape or any other desired shape. The portable energy source 120 is shown attached to the rear surface 192 of the portable audio system 100.

FIG. 5B illustrates a front view of the portable audio system 100. A textured grille 194 is applied to the front surface 190. Acoustic energy from drivers (not shown) inside the portable audio system 100 radiates through the grille 194 substantially unimpeded. Additionally, the grille 194 is designed to protect the drivers from external debris while providing a finished appearance to the portable audio system 100. The grille 194 can be fabricated from metal, plastic, cloth or any other suitable material.

FIG. 5C illustrates a side view of the portable audio system 100. The front surface 190 of the portable audio system 100 is set to a predetermined angle 196 relative to a vertical plane 198. In one embodiment, the angle 196 is 11.5 degrees. Other angles can also be used. The angle provides an upward tilt to the front surface 190 of the portable audio system 100. Additionally, the angle provides increased mechanical stability to the portable audio system 100. In some embodiments, an external audio source, such as a MP3 player can include an angled base which causes the external audio source to lean at a different angle when inserted into the docking cradle 150. In this example, the docking cradle 150 can be independently tilted to maintain the angle specified by the manufacturer of the external audio source. Alternatively, a docking cradle adapter or insert can be used having a shape that facilitates the proper positioning of the external audio device. For example, if the lean angle on an external audio device is 15.0 degrees and the lean angle of the portable audio system 100 is 11.5 degrees, than the docking cradle 150 can include a lean angle of 3.5 degrees to compensate for the difference. In one embodiment, a bottom surface of the pocket 170 of the docking cradle 150 shown in FIG. 3 can be oriented at any desired angle relative to the front surface 190 of the portable audio system 100.

Figure 6A:
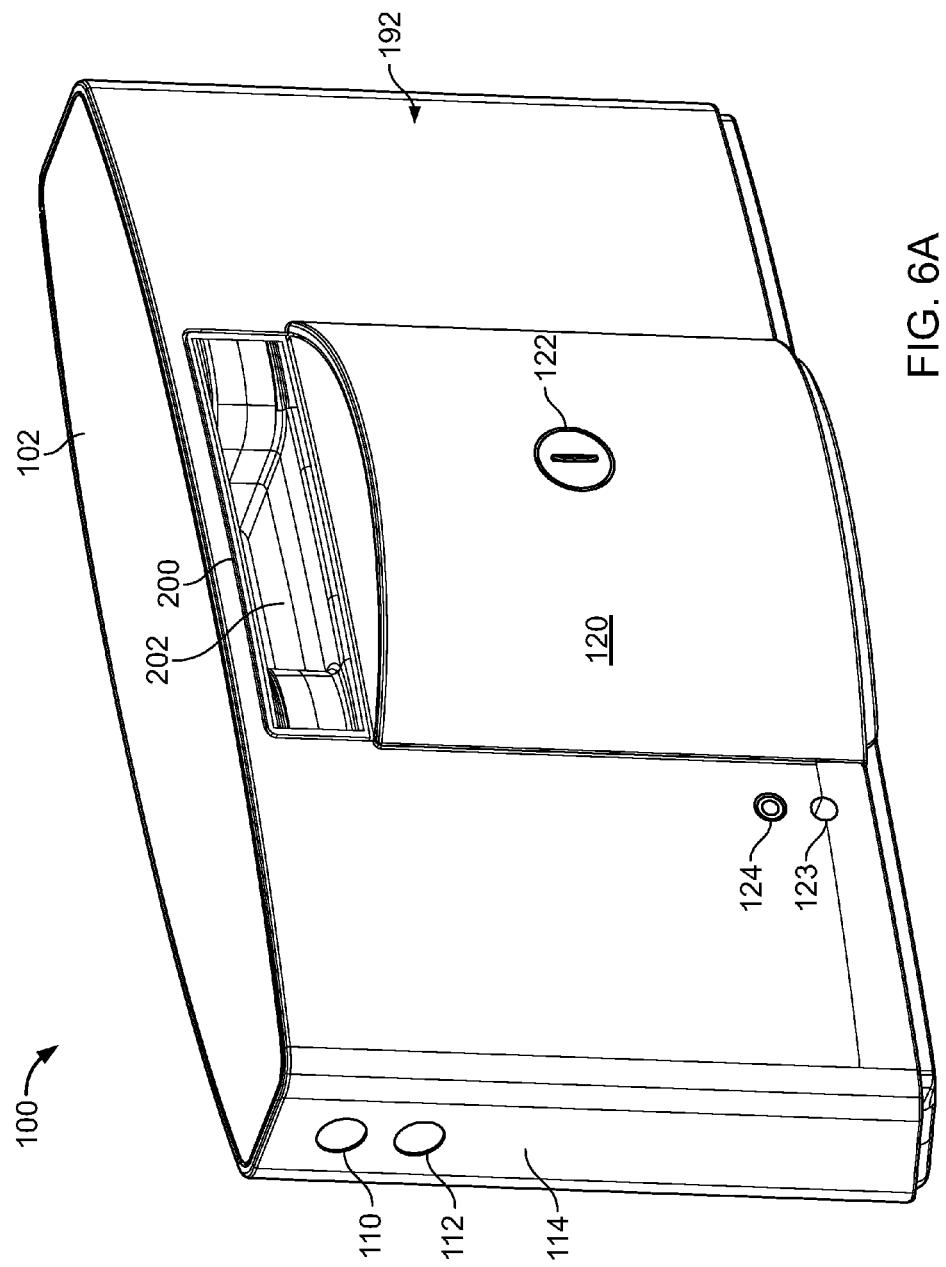
FIG. 6A illustrates a rear perspective view of the portable audio system.

FIG. 6A illustrates a rear perspective view of a portable audio system 100. The portable energy source 120 is shown attached to the rear surface 192 of the housing 102 though the securing mechanism 122. The audio input terminal 124 is configured to accept an external audio source. For example, the audio input terminal 124 could be an RCA jack, a 3.5 mm jack, a digital input, or any other suitable connector. In one embodiment, the input power connector 123 receives DC voltage from an AC adapter. In another embodiment, the input power connector 123 can also be configured to receive AC power. The controllers 110, 112 are shown on the side surface 114 of the housing 102.

An open end 200 of a waveguide 202 is also shown exiting the back surface 192 of the housing 102. The open end 200 can be shaped and sized to function as handle for the portable audio system 100. A similar location and shape can also be used for the exit of a port in a portable audio system utilizing a ported acoustic enclosure (not shown) instead of a waveguide. The opening for either waveguide or port can generically be referred to as an acoustic exit. For example, the open end 200 can be shaped to facilitate the grasping of the housing 102 with multiple fingers from a human hand. The handle can be used to move the portable audio system 100.

In one embodiment, the waveguide 202 includes a flare positioned at the acoustic exit 200. The acoustic exit 200 can also include a textured surface on an interior surface of the waveguide 202. The textured surface provides a griping surface for the fingers. The textured surface can be formed into the surface of the waveguide 202. For example, grooves can be engraved into the material in which the waveguide 202 is formed. Alternatively, a textured pad can be adhered to the interior surface of the waveguide 202. The textured pad can include an abrasive sandpaper material. Other techniques for creating a textured surface can also be used.

Figure 6B:
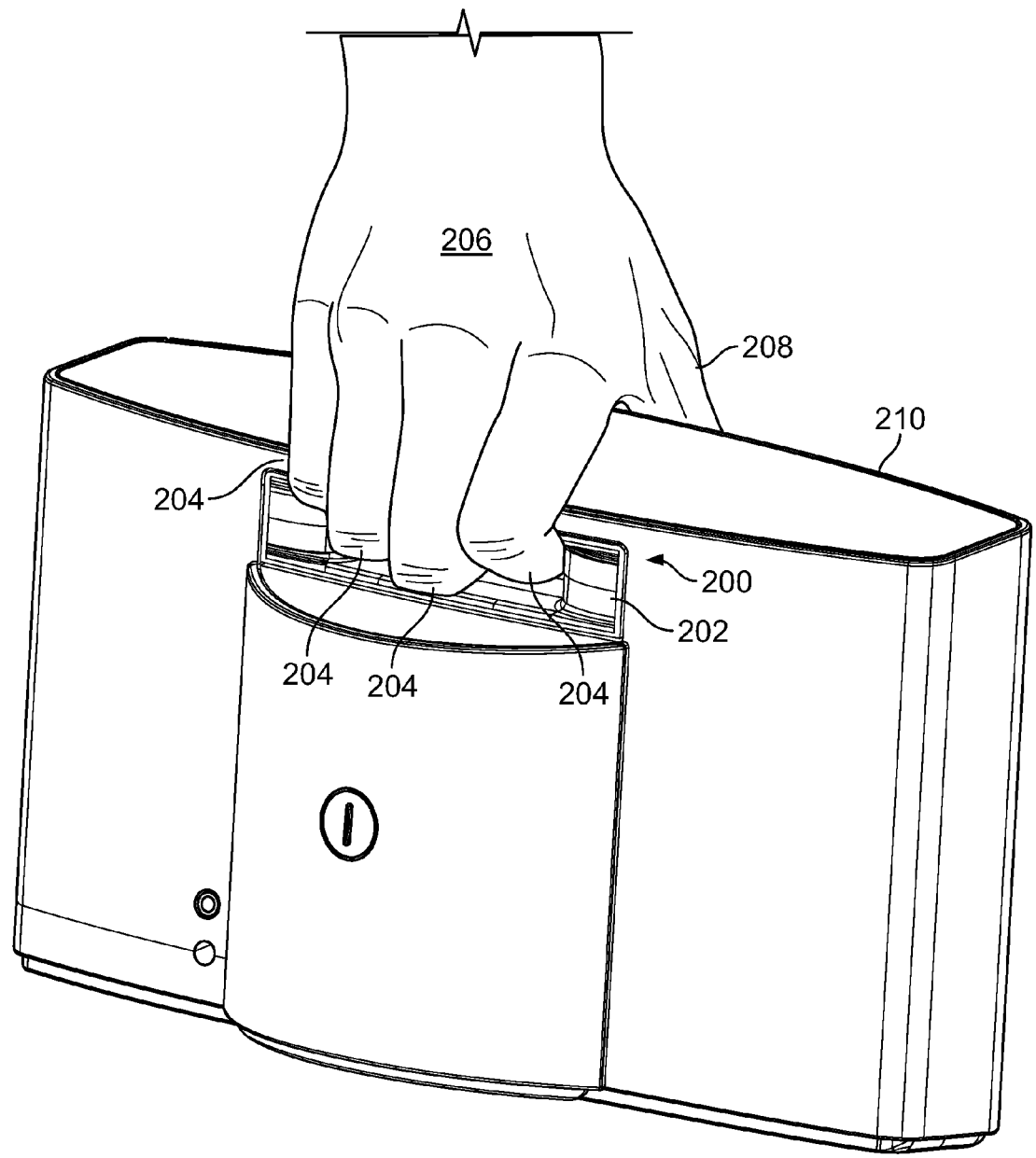
FIG. 6B illustrates another rear perspective view of the portable audio system.

FIG. 6B illustrates another rear perspective view of the portable audio system 100 of FIG. 6A. One technique to carry the portable audio system 100 is shown. One or more fingers 204 of a human hand 206 are inserted into the acoustic exit 200 of the waveguide 202. The thumb 208 of the hand 206 can rest against the front surface 190 (FIG. 5A) of the portable audio system 100. Alternatively, the thumb 208 can rest against a top surface 210 of the portable audio system 100.

FIG. 7A is a perspective view of a waveguide 250 according to one embodiment of the invention. The waveguide 250 includes a first subsection 252 and a second subsection 254. The first subsection 252 bends around a first axis 256 and the second subsection 254 bends around a second axis 258. The cross-sectional area of the waveguide 250 can be in the shape of a rectangle including a long dimension 260 and a short dimension 262. In a waveguide having a cross-sectional area with an aspect ratio that is substantially different from unity, the waveguide turning around an axis parallel to the long dimension has been shown to reduce undesired noise as compared to turning around an axis parallel to the short dimension. Thus, in one embodiment, the waveguide in the first subsection 252 bends around the axis 256 parallel to the long dimension 260 and in the second subsection 254 bends around the axis 258 parallel to the long dimension 260. Although the waveguide 250 is shown having a substantially rectangular cross-section, any other suitable shape can also be used, such as an oval shape. The aspect ratios of the first subsection 252 and the second subsection 254 may or may not be the same.

In one embodiment, the second axis 258 is not parallel to the first axis 256. For example, in the embodiment shown, the second axis 258 lies in a plane that is perpendicular to the first axis 256. In one embodiment, each bend is a ninety degree bend. However, the magnitude of the bend can be any desired amount.

A third subsection 264 acoustically couples the first subsection 252 to the second subsection 254. The third subsection 264 includes a first cross-sectional area having a first aspect ratio substantially matching that of the first subsection 252. The third subsection 264 includes a second cross-sectional area having a second aspect ratio substantially matching that of the second subsection 254. The aspect ratio of the third subsection 264 varies smoothly from the first aspect ratio to the second aspect ratio.

Figure 7B:
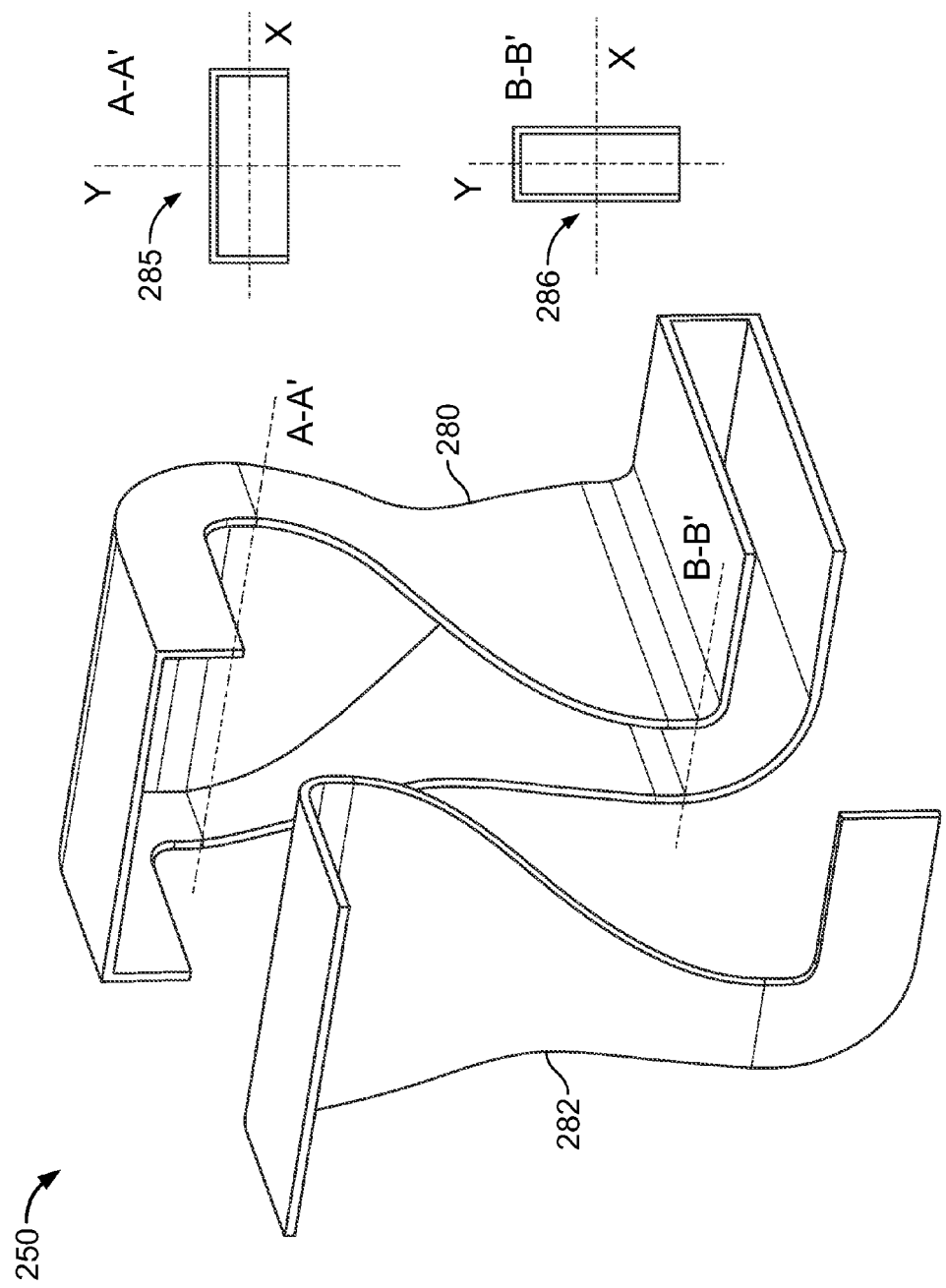
FIG. 7B is an exploded view of the waveguide of FIG. 7A.

Although the third subsection 264 connecting the first 252 and second subsections 254 can be twisted in order to transition from the first aspect ratio to the second aspect ratio (from the first axis 256 to the second axis 258), the waveguide, which is normally constructed of an injection moldable material such as plastic, would thus be a difficult structure to mold that would require complex tooling. FIG. 7B is an exploded view of the waveguide 250 of FIG. 7A, illustrating a simple, easily moldable waveguide structure. As shown, the first aspect ratio 285 (cross section cut through the A-A' plane) of the third subsection 264 and the second aspect ratio 286 (cross section cut through the B-B' plane) are represented as cross sections having long and short dimensions in the X-Y axis, with the long dimension in the X-axis at the first aspect ratio 285 and the long dimension in the Y-axis at the second aspect ratio 286, whereby the X-axis and the Y-axis do not rotate in the transition from the first aspect ratio 285 to the second aspect ratio 286 but rather the dimension in the X-axis gradually changes from the long dimension to the short dimension and the dimension in the Y-axis simultaneously gradually changes from the short dimension to the long dimension. In contrast, a twisted waveguide will have a rotating X-Y axis. The embodiment of FIGS. 7A and 7B produces a structure that is easier to mold than the twisted waveguide. It should be noted that, if the cross sectional area of A-A' is the same as the cross sectional area of B-B', the cross sectional area of the third subsection 264 should remain constant during its transition. Alternatively, if the overall waveguide comprises a changing cross sectional area according to a predetermined law related to position along the waveguide, that law should be maintained in the third subsection 264 during its transition from the first aspect ratio to the second aspect ratio.

In one embodiment, the waveguide 250 is fabricated from multiple parts. For example, the waveguide 250 can be fabricated from a first part 280 and a second part 282. The parts 280, 282 can be molded through known manufacturing techniques. For example, the parts 280, 282 can be rigid structures formed by an injection molding process using a synthetic resin, such as LUSTRAN™ 448 (Bayer Corporation, Elkhart, Ind.). The first part 280 corresponds to a main body of the waveguide 250 and the second part 282 corresponds to a cover section. Part 280 can be molded using simple tooling and with a single action in the molding machine. The two parts 280, 282 can be molded separately and then bonded together. Other techniques for fabricating the waveguide 250 can also be used.

Figure 8:
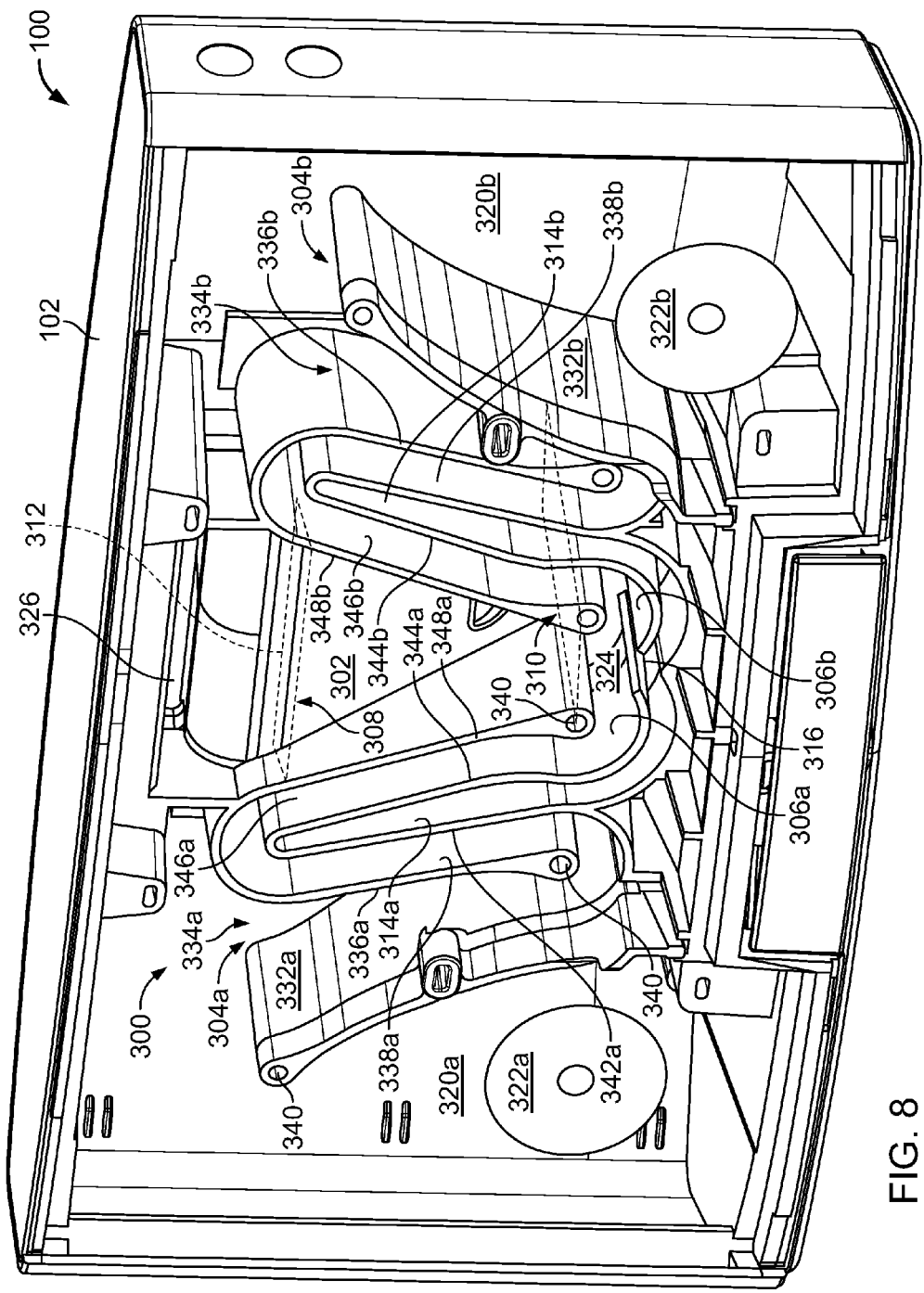
FIG. 8 is a perspective view of the interior of the portable audio system illustrating a waveguide.

FIG. 8 is a perspective view of the interior of the portable audio system 100 illustrating a waveguide 300. The waveguide 300 can be described as a split waveguide structure which includes a trunk waveguide section 302 and two branch waveguide sections 304a, 304b. Junction ends 306a, 306b of the branch waveguide sections 304a, 304b are coupled to the trunk waveguide section 302. The long dimension of the cross section of the open end at the top 308 of the trunk can be oriented differently than the long dimension of the cross section at the junction end 310. This change in the orientation of the long dimension allows the trunk waveguide section 302 to bend around the short dimension 312 of its cross-sectional shape at the top 308 of the trunk waveguide section 302. Additionally, the aspect ratio at the junction end 310 of the trunk waveguide section 302 can be different from the aspect ratio at the junction end 310 of the trunk waveguide section 302.

Each of the branch waveguide sections 304a, 304b is wrapped around an empty cavity 314a, 314b. The cavities 314a, 314b are partially formed by two walls. A vent 316 along with the cavities 314a, 314b forms a resonant peak reducing mechanism. Since the waveguide is wrapped around a "double wall", a large turning radius for the branch waveguide sections 304a, 304b is provided. Additionally, the volume and length of the cavities 314a, 314b can be chosen to reduce any undesired resonant peak due to the nature of the waveguide 300.

The housing 102 includes the waveguide 300 having first left and right subsections 320a, 320b that contain left and right acoustic drivers 322a, 322b. The drivers 322a, 322b each include a radiating surface with a first side facing free air and a second side, opposite the first, facing into the housing 102 and feeding acoustic waves into the branch waveguide sections 304a, 304b.

Each branch waveguide section 304a, 304b is a folded continuous tube defining an interior passage and extending from one of the first left and right subsections 320a, 320b containing the drivers 322a, 322b at either end of the waveguide to a branch junction 324. The trunk waveguide section 302 extends from the branch junction 324 to a single trunk opening 326 having a flared end. Each of the folds defines subsections within each branch waveguide section 304a, 304b. Each subsection is bounded by baffles or panels extending from the front to the rear of the waveguide. The housing 102 can also support other components such as an integrated MP3 player, a CD player, a radio, an AM antenna, an amplifier, and/or a power supply, for example.

The first left and right subsections 320a, 320b, respectively, are partially formed by the outside surfaces (facing the drivers) of tapered first panels 332a, 332b adjacent the drivers 322a, 322b and extend to the second subsections 334a, 334b. The second subsections 334a, 334b are formed by the inside surfaces (facing the trunk waveguide section 302) of the tapered first panels 332a, 332b and an outside surface of second panels 336a, 336b and extend to the third subsections 338a, 338b.

Generally, each of the panels is a curved surface extending from the front or back of the waveguide and includes a free edge. A contoured post 340 is formed at various free edges to reduce losses and turbulence of the acoustic pressure waves. The third subsections 338a, 338b are formed by the inside surfaces of the second panels 336a, 336b and the outside surface of third panels 342a, 342b. Left and right cavities 314a, 314b are formed by the inside surfaces of the third panels 342a, 342b and the outside surfaces of fourth panels 344a, 344b.

The fourth subsections 346a, 346b are formed by the inside surfaces of the fourth panels 344a, 344b and the outside surface of the trunk waveguide section walls 348a, 348b and extend from the third subsections 338a, 338b to connect with the trunk waveguide section 302 at the branch junction 324.

In one embodiment, the cross-sectional area of each of the branch waveguide sections 304a, 304b continuously decreases along a path from the first left and right subsections 320a, 320b to the branch junction 324. The first and second subsections are relatively large and can be more tapered compared with the third and fourth subsections and the common trunk waveguide section.

In one embodiment, the total volume and cross-sectional area profiles of the left and right branch waveguide sections 304a, 304b are similar. However, the left and right branch waveguide sections 304a, 304b can be asymmetrical because of the need to accommodate the packaging of differently-sized electronic components within the housing 102.

The vent 316 can be located proximate to the branch junction 324. The vent 316 connects the left and the right cavities 314a, 314b to the trunk waveguide section 302. The left and right cavities 314a, 314b form acoustic structures that are sized and configured for reducing the magnitude of a resonance peak. The length of the left and right cavities 314a, 314b are chosen to exhibit a resonance behavior in the frequency range where it is desired to control the magnitude of a resonance peak in the waveguide. The left and right cavities 314a, 314b are designed such that the acoustic pressure due to the resonance in each cavity, that is present at the branch junction 324, destructively interferes with the acoustic pressure present within the waveguide 300, thus reducing the peak magnitude.

It should be noted that the location of the vent 316 and the cavities 314a, 314b are not limited to what has shown in FIG. 8. The location of the cavities can be anywhere along a general waveguide system corresponding to the pressure maximum of the target standing wave and the particular resonance peak to be attenuated. The use of such cavities for damping out a resonance peak is not limited to waveguides having common trunk and branch section configurations.

By establishing a vent 316 in the trunk waveguide section 302, a target frequency component, 380 Hz in one example is significantly reduced. Resistive acoustical dampening materials can be located proximate the vent 316 and/or in one or both of the cavities 314a, 314b. The cavities 314a, 314b can also be bifurcated into multiple cavities for reducing multiple resonance peaks.

Additional information concerning folded waveguides and the use of cavities for damping out a resonance peak can be found in patent application Ser. No. 10/805,440, filed Mar. 19, 2004 and patent application Ser. No. 10/914,497, filed Aug. 9, 2004, which are incorporated herein by reference.

The foregoing description is intended to be merely illustrative of the present invention and should not be construed as limiting the appended claims to any particular embodiment or group of embodiments. Thus, while the present invention has been described with reference to exemplary embodiments, it should also be appreciated that numerous modifications and alternative embodiments may be devised by those having ordinary skill in the art without departing from the broader and intended spirit and scope of the present invention as set forth in the claims that follow. In addition, the section headings included herein are intended to facilitate a review but are not intended to limit the scope of the present invention. Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise; and h) no specific sequence of acts or steps is intended to be required unless specifically indicated.

What is claimed is:

1. An audio system comprising:
a housing;
a first acoustic driver and a second acoustic driver enclosed within the housing to radiate acoustic energy;
an acoustic exit located on a surface of the housing; and
a grille applied to a front surface of the housing through which acoustic energy from the first and second drivers inside the housing radiates;
wherein the acoustic exit is located adjacent an exterior surface of the housing, the acoustic exit and the exterior surface being configured to facilitate grasping of the housing with a plurality of fingers and the thumb from the single human hand;
wherein the acoustic exit exits the surface of the housing such that the plurality of fingers can be inserted into the exit while the thumb of the same hand can rest on at least one of the top surface and the front surface of the housing.

2. The audio system of claim 1, further comprising a user interface located on a surface of the housing.

3. The audio system of claim 2, wherein the user interface comprises controls to operate audio system functions comprising at least one of audio volume, audio track selection, audio track skip, audio track stop, audio track pause, audio track rewind, audio track fast forward, and audio track play.

4. The audio system of claim 2, wherein the user interface comprises at least one control configured to be programmed to perform a specific function.

5. The audio system of claim 1, further comprising a display located on a surface of the housing, the display configured to display at least one of information, graphics, and video images.

6. The audio system of claim 1, further comprising a power input terminal for connecting an external power source.

7. The audio system of claim 1, further comprising an auxiliary input terminal configured to couple an external audio source to the audio system.

8. The audio system of claim 1, wherein a bottom surface of the housing comprises a at least one of rubber, plastic, silicone, and polypropylene, the bottom surface configured to isolate and stabilize the housing while the drivers of the audio system radiate acoustic energy.

9. The audio system of claim 1, wherein the front surface of the housing comprises a curved shape.

10. The audio system of claim 1, wherein the grille comprises metal.

11. The audio system of claim 1, wherein the acoustic exit is generally located on a back surface of the housing between the first and second acoustic drivers.

12. The audio system of claim 1, wherein the housing comprises a generally parallelepipedal shape.

13. The audio system of claim 1, further comprising a wireless remote control to control functions comprising at least one of audio volume, audio track selection, audio track skip, audio track stop, audio track pause, audio track rewind, audio track fast forward, and audio track play.

14. The audio system of claim 1, wherein the acoustic exit comprises a flared end.

15. An audio system comprising:
a housing;
an electronic audio circuit coupled to the housing;
an acoustic driver enclosed within the housing to radiate acoustic energy;
a grille applied to a front surface of the housing through which acoustic energy from the driver radiates; and
an acoustic exit located on a rear surface of the housing, opposite the front surface of the housing;
wherein the acoustic exit is located adjacent an exterior surface of the housing, the acoustic exit and the exterior surface being configured to facilitate grasping of the housing with a plurality of fingers and the thumb from the single human hand;
wherein the acoustic exit exits a back surface of the housing such that at least one of the plurality of fingers and thumb can be inserted into the exit while at least one of the plurality of fingers and the thumb of the same hand can rest on the top surface of the housing.

16. The audio system of claim 15, further comprising an auxiliary input terminal configured to couple an external audio source to the electronic audio circuit.

17. The audio system of claim 15, further comprising a user interface located on a surface of the housing.

18. The audio system of claim 15, wherein the acoustic exit comprises a generally rectangular shape and further comprises a textured surface along an interior portion to provide a gripping surface for at least one of the plurality of fingers and the thumb.

19. The audio system of claim 15, wherein the acoustic exit comprises a flared end.

20. An audio system comprising:
a housing;
an electronic audio circuit coupled to the housing;
an acoustic driver enclosed within the housing to radiate acoustic energy;
a control located on the housing for adjusting the volume of the acoustic driver;
a grille applied to a front surface of the housing through which acoustic energy from the first and second drivers inside the housing radiates; and
an acoustic exit located on a rear surface of the housing, opposite the front surface of the housing;
wherein the acoustic exit is located adjacent an exterior surface of the housing, the acoustic exit and the exterior surface being configured to facilitate grasping of the housing with a plurality of fingers and the thumb from the single human hand;
wherein the acoustic exit exits the housing such that at least one of the plurality of fingers and thumb can be inserted into the exit while at least one of the thumb and the plurality of fingers of the same hand can rest on the top surface of the housing.

\* \* \* \* \*